United States Patent
Lin et al.

(10) Patent No.: US 10,128,195 B2
(45) Date of Patent: Nov. 13, 2018

(54) SUBSTRATE DESIGN WITH BALANCED METAL AND SOLDER RESIST DENSITY

(71) Applicant: Taiwan Semiconductor Manufacturing Company, Ltd., Hsin-Chu (TW)

(72) Inventors: Yu-Wei Lin, New Taipei (TW); Guan-Yu Chen, Hsin-Chu (TW); Yu-Min Liang, Zhongli (TW); Tin-Hao Kuo, Hsin-Chu (TW); Chen-Shien Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/226,246

(22) Filed: Aug. 2, 2016

(65) Prior Publication Data

US 2016/0365322 A1 Dec. 15, 2016

Related U.S. Application Data

(63) Continuation of application No. 14/845,799, filed on Sep. 4, 2015, now Pat. No. 9,425,117, which is a
(Continued)

(51) Int. Cl.
*H05K 1/18* (2006.01)
*H01L 23/00* (2006.01)
(Continued)

(52) U.S. Cl.
CPC ............ *H01L 23/562* (2013.01); *H01L 23/13* (2013.01); *H01L 23/49811* (2013.01);
(Continued)

(58) Field of Classification Search
CPC ... H05K 1/00; H05K 1/11; H05K 1/16; H05K 1/18; H05K 3/00; H05K 3/10; H05K 3/46;
(Continued)

(56) References Cited

U.S. PATENT DOCUMENTS 6,350,365 B1 * 2/2002 Koyama ............... H01L 21/486
205/125
6,380,633 B1 * 4/2002 Tsai .................. H01L 23/49838
257/690

(Continued)

FOREIGN PATENT DOCUMENTS

| CN | 201286194 Y | 8/2009 |
| CN | 102593335 A | 7/2012 |
| EP | 2547184 A1 | 1/2013 |

*Primary Examiner* — Xiaoliang Chen
(74) *Attorney, Agent, or Firm* — Slater Matsil, LLP (57) ABSTRACT

A package includes a package substrate, which includes a middle layer selected from the group consisting of a core and a middle metal layer, a top metal layer overlying the middle layer, and a bottom metal layer underlying the middle layer. All metal layers overlying the middle layer have a first total metal density that is equal to a sum of all densities of all metal layers over the middle layer. All metal layers underlying the middle layer have a second total metal density that is equal to a sum of all densities of all metal layers under the middle layer. An absolute value of a difference between the first total metal density and the second total metal density is lower than about 0.1.

20 Claims, 7 Drawing Sheets

Related U.S. Application Data continuation of application No. 14/080,106, filed on Nov. 14, 2013, now Pat. No. 9,153,550.

(51) Int. Cl.
  *H01L 23/498* (2006.01)
  *H01L 23/13* (2006.01)

(52) U.S. Cl.
  CPC .. *H01L 23/49816* (2013.01); *H01L 23/49822* (2013.01); *H01L 23/49827* (2013.01); *H01L 23/49838* (2013.01); *H01L 24/14* (2013.01); *H01L 24/16* (2013.01); *H01L 24/17* (2013.01); *H05K 1/181* (2013.01); *H01L 24/13* (2013.01); *H01L 2224/131* (2013.01); *H01L 2224/1308* (2013.01); *H01L 2224/13144* (2013.01); *H01L 2224/13147* (2013.01); *H01L 2224/13155* (2013.01); *H01L 2224/13164* (2013.01); *H01L 2224/16013* (2013.01); *H01L 2224/16235* (2013.01); *H01L 2224/16238* (2013.01); *H01L 2924/181* (2013.01); *H01L 2924/3511* (2013.01); *H01L 2924/3841* (2013.01)

(58) Field of Classification Search
  CPC ......... H01L 21/44; H01L 21/78; H01L 23/00; H01L 23/12; H01L 23/34; H01L 23/48; H01L 23/58; H01L 23/64
  USPC ....... 174/262, 250, 259, 261, 263, 264, 266; 361/748, 767; 257/676, 698, 724, 737, 257/773; 438/622
  See application file for complete search history.

(56) References Cited

U.S. PATENT DOCUMENTS

| | | | | |
|---|---|---|---|---|
| 6,545,353 B2* | 4/2003 | Mashino | ........... | H01L 23/49822 257/700 |
| 6,548,767 B1* | 4/2003 | Lee | ........... | H05K 1/115 174/255 |
| 7,223,687 B1* | 5/2007 | Ho | ........... | H05K 3/0058 29/829 |
| 8,083,123 B2* | 12/2011 | Tanno | ........... | H01L 21/4853 228/180.22 |
| 8,309,957 B2 | 11/2012 | Chatterjee et al. | | |
| 8,530,755 B2* | 9/2013 | Wakita | ........... | H05K 3/4644 174/257 |
| 8,890,628 B2* | 11/2014 | Nair | ........... | H01L 25/16 257/416 |
| 8,969,732 B2* | 3/2015 | Amano | ........... | H05K 3/4602 174/255 |
| 9,153,550 B2* | 10/2015 | Lin | ........... | H01L 24/14 |
| 9,338,883 B2* | 5/2016 | Watanabe | ........... | H05K 1/0271 |
| 9,425,117 B2* | 8/2016 | Lin | ........... | H01L 24/14 |
| 9,704,735 B2* | 7/2017 | Konchady | ........... | H01L 23/5383 |
| 2003/0102151 A1* | 6/2003 | Hirose | ........... | H05K 1/0224 174/250 |
| 2004/0065960 A1* | 4/2004 | Egitto | ........... | H01L 21/486 257/774 |
| 2004/0151882 A1* | 8/2004 | Tani | ........... | H05K 1/056 428/209 |
| 2004/0227239 A1* | 11/2004 | Murata | ........... | H01L 23/498 257/738 |
| 2005/0016768 A1* | 1/2005 | Zollo | ........... | H05K 3/4623 174/262 |
| 2006/0131176 A1* | 6/2006 | Hsu | ........... | C25D 5/022 205/125 |
| 2006/0237389 A1* | 10/2006 | Chou | ........... | H05K 3/4069 216/13 |
| 2007/0057375 A1* | 3/2007 | Nakamura | ........... | H01L 21/4857 257/758 |
| 2007/0170598 A1* | 7/2007 | Iijima | ........... | H05K 3/4617 257/779 |
| 2007/0194432 A1* | 8/2007 | Hsu | ........... | H01L 23/49822 257/698 |
| 2007/0230151 A1* | 10/2007 | Hayashi | ........... | H05K 1/162 361/795 |
| 2007/0281464 A1* | 12/2007 | Hsu | ........... | H05K 3/465 438/624 |
| 2008/0048303 A1 | 2/2008 | Amagai et al. | | |
| 2008/0062657 A1* | 3/2008 | Seo | ........... | H01L 23/5389 361/748 |
| 2008/0093726 A1* | 4/2008 | Preda | ........... | H01L 23/50 257/700 |
| 2008/0107863 A1* | 5/2008 | Ikeda | ........... | H01L 21/4857 428/137 |
| 2009/0057001 A1* | 3/2009 | Jung | ........... | H01L 23/49838 174/264 |
| 2009/0174045 A1* | 7/2009 | Arvin | ........... | H01L 23/49811 257/676 |
| 2009/0273073 A1* | 11/2009 | Tachibana | ........... | H01L 21/563 257/692 |
| 2009/0284935 A1* | 11/2009 | Chen | ........... | H05K 1/0265 361/748 |
| 2009/0290316 A1* | 11/2009 | Kariya | ........... | H01L 23/50 361/767 |
| 2009/0294166 A1* | 12/2009 | Yoshimura | ........... | H05K 3/445 174/264 |
| 2009/0321932 A1* | 12/2009 | Gonzalez | ........... | H05K 3/4682 257/750 |
| 2010/0090339 A1* | 4/2010 | Kumar | ........... | G01R 1/0491 257/738 |
| 2011/0088938 A1* | 4/2011 | Ko | ........... | H05K 3/4647 174/263 |
| 2011/0240351 A1* | 10/2011 | Wakita | ........... | H05K 3/4644 174/258 |
| 2012/0067635 A1* | 3/2012 | Nang | ........... | B23K 1/0016 174/260 |
| 2012/0132817 A1* | 5/2012 | Shaw | ........... | G01T 1/2018 250/369 |
| 2012/0181569 A1 | 7/2012 | Choi | | |
| 2013/0020116 A1* | 1/2013 | Mano | ........... | H05K 1/0237 174/258 |
| 2013/0127037 A1* | 5/2013 | Mori | ........... | H01L 23/3677 257/712 |
| 2013/0161795 A1* | 6/2013 | Owada | ........... | H01L 21/6835 257/620 |
| 2014/0014402 A1* | 1/2014 | Cho | ........... | H01B 3/40 174/258 |
| 2014/0060908 A1* | 3/2014 | Park | ........... | H01L 23/3121 174/257 |
| 2014/0062607 A1* | 3/2014 | Nair | ........... | H01L 25/16 331/68 |
| 2014/0138129 A1* | 5/2014 | Rouhana | ........... | H05K 1/092 174/257 |
| 2014/0239505 A1* | 8/2014 | Wu | ........... | H01L 23/49827 257/773 |
| 2015/0130050 A1* | 5/2015 | Lin | ........... | H01L 24/14 257/737 |
| 2015/0282301 A1* | 10/2015 | Nishida | ........... | H01L 23/12 174/251 |
| 2015/0380332 A1* | 12/2015 | Lin | ........... | H01L 24/14 361/783 |

* cited by examiner

SUBSTRATE DESIGN WITH BALANCED METAL AND SOLDER RESIST DENSITY

PRIORITY CLAIM AND CROSS-REFERENCE

This application is a continuation of U.S. patent application Ser. No. 14/845,799, entitled "Substrate Design with Balanced Metal and Solder Resist Density," filed on Sep. 4, 2014, which application is a continuation of U.S. patent application Ser. No. 14/080,106, entitled "Substrate Design with Balanced Metal and Solder Resist Density," filed on Nov. 14, 2013, now U.S. Pat. No. 9,153,550 B2, which applications are incorporated herein by reference.

BACKGROUND

Bump-on-Trace (BOT) structures are used in flip chip packages, wherein metal bumps are bonded onto narrow metal traces in package substrates directly, rather than bonded onto metal pads that have larger sizes than the respective connecting metal traces. The BOT structures require smaller chip areas, and the manufacturing cost of the BOT structures is low. The conventional BOT structures may achieve the same reliability as the conventional bond structures that are based on metal pads. In a typical BOT structure, a solder region is formed on a surface of a copper bump of a device die. The solder region bonds the copper bump to a metal trace in a package substrate. The solder region contacts a top surface and sidewalls of the metal trace, hence forming the BOT structure.

Since the existing BOT structures have very small spacings, bridging may occur, wherein the solder region of one BOT bond structure is bridged to a neighboring metal trace. Particularly, the BOT structures in the peripheral areas of the packages are more likely to bridge due to the high density of the BOT structures in the peripheral areas. In addition, in the peripheral areas, the distance of the BOT structures are farther away from the centers of the respective packages. Accordingly, during the reflow process for forming the BOT structures, the shift of the BOT structures caused by the thermal expansion of the metal traces is more significant than in the areas close to the centers of the respective packages. Accordingly, the bridging is more likely to occur. The shift of the BOT structures may be caused by warpage of the package substrate. In addition, in the BOT structures, metal traces are thin, and the volume of the solder used in the BOT structures is small. When the warpage occurs, poor solder join may also occur. Both solder bridging and poor solder joint cause the drop of the assembly yield in the packaging process.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package substrate and a package Bump-On-Trace (BOT) bonding are provided in accordance with various exemplary embodiments. The variations of the embodiments are discussed. Throughout the various views and illustrative embodiments, like reference numbers are used to designate like elements.

Figure 1:
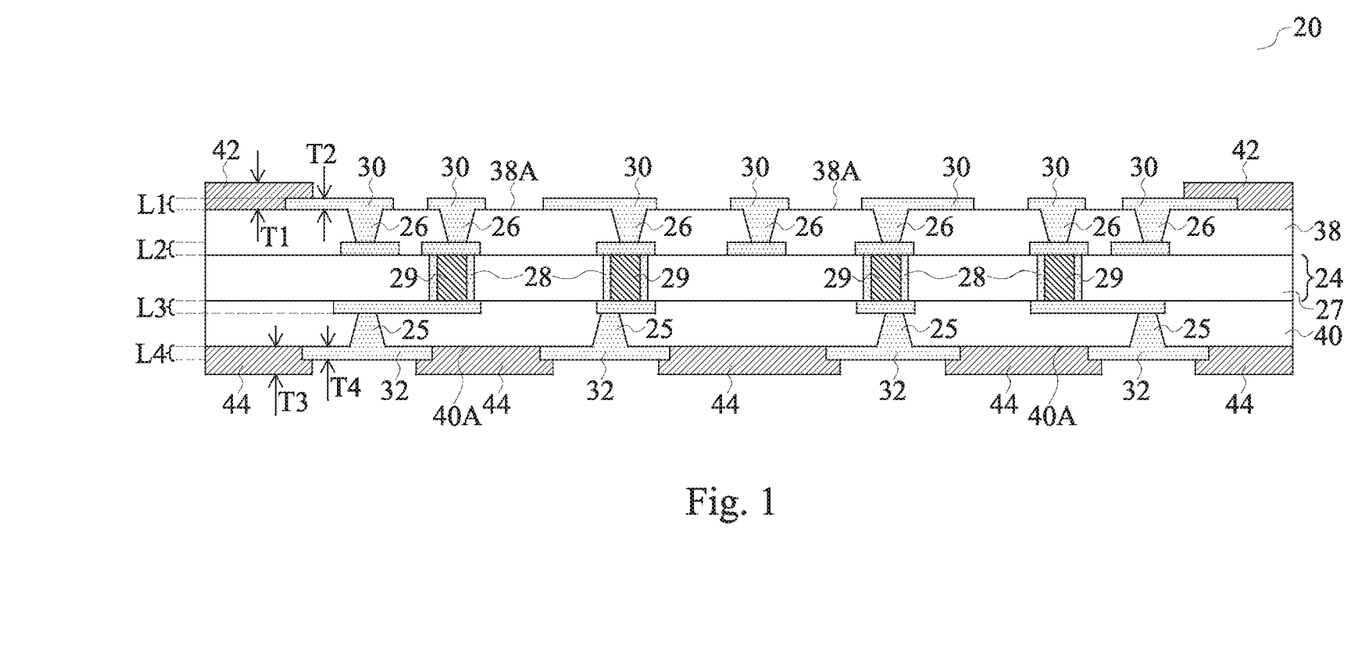
FIG. 1 illustrates a cross-sectional view of a package substrate in accordance with some exemplary embodiments, wherein the package substrate includes a core.

FIG. 1 illustrates a cross-sectional view of package substrate 20. Package substrate 20 may include core 24, and metal layers formed on the opposite sides of core 24. In accordance with some embodiments, the number of metal layers over core 24 is equal to the number of metal layers under core 24. Throughout the description, the term "metal layer" refers to the collection of all metal features, including, and not limited to, metal traces and metal pads, that are at the same level. The corresponding parts/layers of the metal features in the same metal layer are formed of the same materials that have the same compositions. For example, all metal features in a metal layer may include copper, or a copper layer and a nickel layer over the copper layer. In some exemplary embodiments as shown in FIG. 1, package substrate 20 includes metal layers L2 overlying core 24, and metal layer L1 over metal layer L2. Package substrate 20 further includes metal layer L3 underlying core 24, and metal layer L4 underlying metal layer L3.

Metal layers L1, L2, L3, and L4 are electrically interconnected through metal vias 25, 26, and 28. Accordingly, metal traces 30, which are parts of metal layer L1, are electrically connected to metal pads 32, which are parts of metal layer L4. The metal features in metal layers L1, L2, L3, and L4 may comprise copper, aluminum, nickel, gold, or combinations thereof. Core 24 includes core dielectric layer 27, and metal vias 28 penetrating through core dielectric layer 27. In some embodiments, core dielectric layer 27 comprises one or more material selected from epoxy, resin, glass fiber, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), combinations thereof, and multi-layers thereof. Metal vias 28 may be formed as conductive pipes in some exemplary embodiments. The internal volumes of metal vias 28 are filled with dielectric filling 29, which may be a material selected from the same candidate materials for forming core dielectric layer 27. In alternative embodiments, conductive pipes 28 comprise air gaps therein. Metal vias 28 electrically interconnect, and may be in physical contact with, the metal features in metal layers L2 and L3.

Dielectric layer 38 is formed over core 24, with the vias 26 that interconnect metal layers L1 and L2 disposed in dielectric layer 38. Dielectric layer 38 may be formed of PP in some exemplary embodiments, while other dielectric materials may also be used. In some embodiments, dielectric layer 38 comprises a planar top surface 38A, wherein the bottom surface of metal layer L1 are over and in contact with top surface 38A. Furthermore, dielectric layer 42 is formed over dielectric layer 38. Dielectric layer 42 may have the lower portions level with metal layer L1, and may, or may not, include upper portions higher than metal layer L1. In some embodiments, dielectric layer 42 has thickness T1 that is greater than thickness T2 of metal layer L1. Dielectric layer 42 may cover some portions of dielectric layer 38, while leaving other portions of dielectric layer 38 exposed. In some embodiments, dielectric layer 42 also covers some parts of metal layer L1. For example, as shown in FIG. 1, dielectric layer 42 covers some parts of metal traces 30.

In some embodiments, dielectric layers 38 and 42 are formed of different dielectric materials. In alternative embodiments, dielectric layers 38 and 42 are formed of a same dielectric material. Dielectric layer 42 may be formed of a solder resist, and hence is referred to as solder resist 42 hereinafter, although it may also be formed of other dielectric materials. Solder resist 42 is a thin lacquer-like layer of polymer. Solder resist 42 may comprise an epoxy resin, a hardener, a color, a filler, and a solvent. For example, the epoxy resin may be o-Cresol novolac epoxy resin, phenol epoxy resin, or Diglycidylether Bisphenol A (DGEBA) epoxy resin. The active ingredient of the hardener may include the reaction product of an amine compound such as an imidazole or melamine. The filler may comprise silicon, aluminum, magnesium, calcium, titanium, or the like. The solvent may comprise glycol ether or the like.

Dielectric layer 40 is formed under core 24 and dielectric layer 40, with the vias 25 that interconnect metal layers L3 and L4 disposed in dielectric layer 40. Dielectric layer 40 may be formed of PP in some exemplary embodiments, while other dielectric materials may also be used. In some embodiments, dielectric layer 40 comprises a planar bottom surface 40A, wherein the top surface of metal layer L4 is over and in contact with bottom surface 40A.

Dielectric layer 44 is formed underlying, and in contact with, dielectric layer 40. Dielectric layer 44 may have the lower portions level with metal layer L4, and may, or may not, include lower portions lower than metal layer L4. In some embodiments, dielectric layer 44 has thickness T3 that is greater than thickness T4 of metal layer L4. In some embodiments, some portions of dielectric layer 44 are overlapped by some parts of metal layer L4. For example, as shown in FIG. 1, dielectric layer 44 is overlapped by some edge parts of metal pads 32.

In some embodiments, dielectric layers 40 and 44 are formed of different dielectric materials. In alternative embodiments, dielectric layers 40 and 44 are formed of a same dielectric material. Dielectric layer 44 may be formed of a solder resist, and hence is referred to as solder resist 44 hereinafter, although it may also be formed of other dielectric materials, which may be a polymer.

Metal layer L1 has density DL1, which is calculated as the ratio of the total top-view area of all metal features in metal layer L1 to the total top-view area of package substrate 20. Similarly, metal layer L2 has density DL2, which is calculated as the ratio of the total top-view area of all metal features in metal layer L2 to the total top-view area of package substrate 20. Metal layer L3 has density DL3, which is calculated as the ratio of the total top-view area of all metal features in metal layer L3 to the total top-view area of package substrate 20. Metal layer L4 has density DL4, which is calculated as the ratio of the total top-view area of all metal features in metal layer L4 to the total top-view area of package substrate 20. All of the metal layers overlying core 24 have a first total metal density. For example, in the structure shown in FIG. 1, the first total metal density is (DL1+DL2). All of the metal layers under core 24 have a second total metal density. For example, in the structure shown in FIG. 1, the second total metal density is (DL3+DL4). In some embodiments, a metal density difference ΔDL is defined as being the absolute value of the difference between the first total metal density and the second metal density. For example, in the illustrated embodiments, metal density difference ΔDL is |(DL1+DL2)−(DL3+DL4)|.

In the embodiments in FIG. 1, there are two metal layers over core 24 and two metal layers underlying core 24. It is appreciated that a package substrate may have different numbers of metal layers than illustrated. For example, a package substrate may include a single metal layer L1' (not shown) over the core and a single metal layer L2' (not shown) under the core. Accordingly, metal density difference ΔDL is |DL1'−DL2'|, wherein DL1' is the metal density of metal layer L1', and DL2' is the metal density of metal layer L2'. Alternatively, a package substrate may include three or more layers over the core, and three or more layers under the core. In these embodiments, the metal density difference ΔDL remains to be the absolute value of the total metal density of all metal layers over the core minus the total metal density of all metal layers under the core.

Metal layers L1 through L4 have Coefficient of Thermal Expansions (CTE) greater than the CTE of core 24. For example, the CTE of metal layers M1 through M4 may be about 16.5 ppm when formed of copper. The CTE of core 24 may be about 10 ppm. When temperature changes, the metal layers over core 24 has an effect opposite to the effect of the metal layers under core 24, which effect, when not balanced and are not fully cancelled each other, may cause the warpage of package substrate 20 when heated or cooled. For example, when heated, the metal layers overlying core 24 tend to cause warpage of package substrate 20 so that the edges of package substrate are lower than the center of package substrate. Conversely, when heated, the metal layers underlying core 24 tend to cause warpage of package substrate 20 so that the edges of package substrate are higher than the center of package substrate. The effect of a metal layer to the warpage increases with the increase in the density of the respective metal layer. Accordingly, to balance and cancel out the effects of all metal layers (such as metal layers L1 through L4), metal density difference ΔDL is designed to be smaller than about 10 percent (which is 0.1) in order to control the warpage of package substrate 20. The warpage directly affects the assembly yield of the package substrate 20, and the higher the warpage is, the lower the assembly yield will be. Experiments results indicated that when metal density difference ΔDL is smaller than about 10 percent, the assembly yield of the package substrates is in an accepted specification that is generally accepted by the packaging industry, while a metal density difference ΔDL greater than 10 percent results in the assembly yield of the respective package substrate to be out of the specification.

Solder resist 42 has density DSR1, which is calculated as the ratio of the total top-view area of solder resist 42 to the total top-view area of package substrate 20. Solder resist 44 has density DSR2, which is calculated as the ratio of the total top-view area of solder resist 44 to the total top-view area of package substrate 20. Similarly, solder resists 42 and 44 have high CTEs (for example, about 60 ppm), which is much higher than the CTE of core 24 (for example, about 10 ppm). The difference between the CTE of solder resists 42/44 and core 24 may also cause the warpage of package substrate 20 when package substrate 20 is heated or cooled. In some embodiments, a solder resist density difference ΔDSR is defined as being the absolute value of the difference between the density DSR1 of solder resist 42 and the density DSR2 of solder resist 42. For example, in the illustrated embodiments, solder resist density difference ΔDSR is |DSR1−DSR2|.

Figure 3:
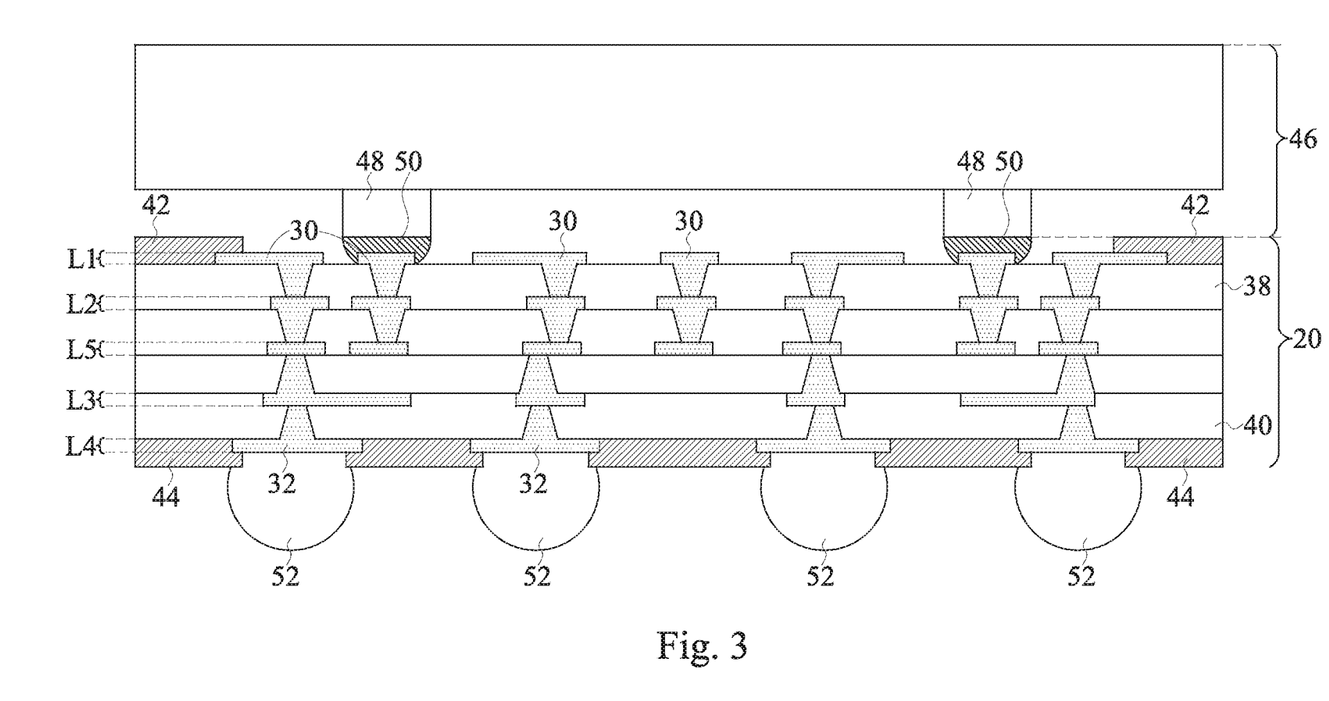
FIG. 3 illustrates the bonding of a package component to a coreless package substrate through BOT bonding in accordance with some alternative exemplary embodiments.
Figure 4:
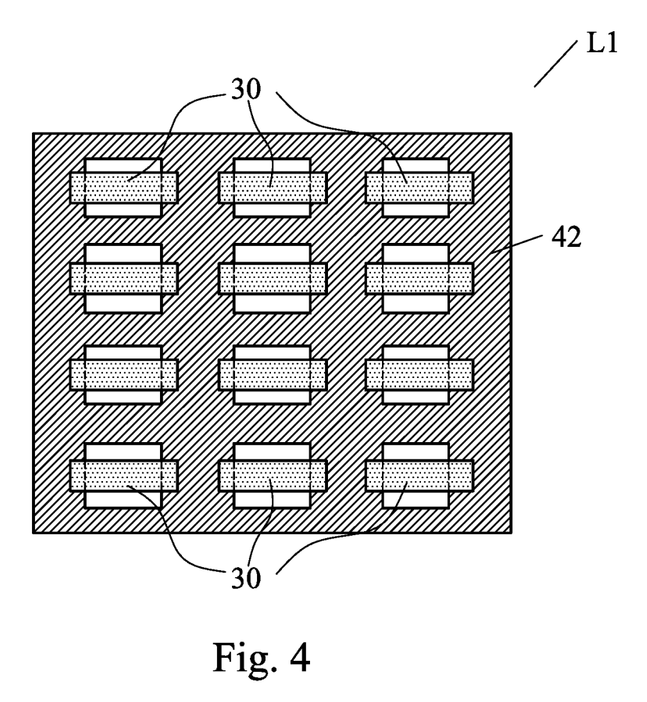
FIGS. 4, 5, 6, and 7 schematically illustrate metal traces, metal pads and dielectric layers in accordance with some embodiments.
Figure 5:
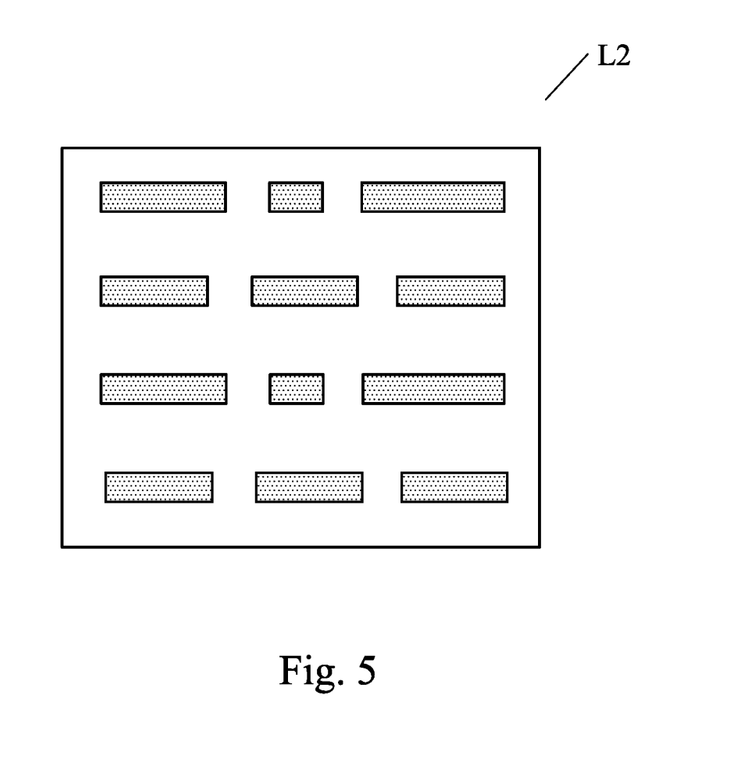
Figure 6:
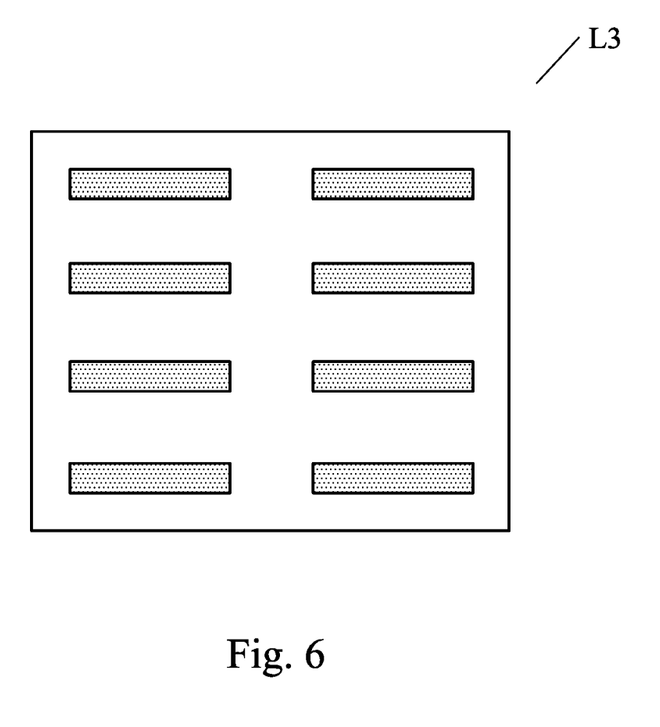
Figure 7:
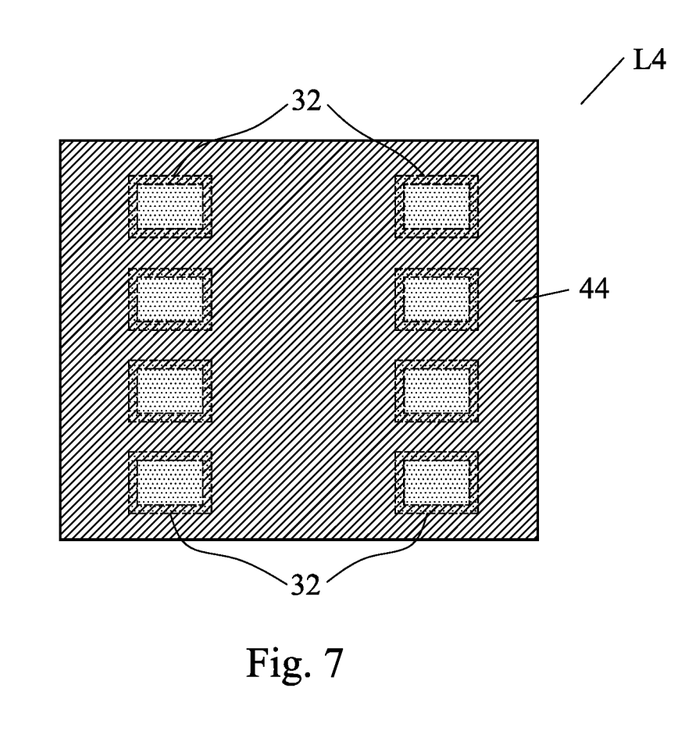

Since solder resists 42 and 44 are on the opposite sides of core 24, they have opposite effects on the warpage of package substrate 20 also. The effect of solder resists 42 and 44 to the warpage increases with the increase in the density of the respective one of solder resists 42 and 44. Accordingly, to balance the effects of solder resists 42 and 44, solder resist density difference ΔDSR is designed to be smaller than about 50 percent (which is 0.5). Experiments results indicated that when solder resist density difference ΔDSR is smaller than about 50 percent, the assembly yield of package substrate will be in an accepted specification that is generally accepted by the packaging industry, while a solder resist density difference ΔDSR greater than 50 percent results in the warpage of package substrate to be out of the specification. Solder resist density difference ΔDSR may also be smaller than about 45 percent (0.45) to leave an acceptable margin so that the assembly yield may be reliably in the specification. For example, FIGS. 4 and 7 schematically illustrate that the solder resist density difference ΔDSR of layers L1 and L4 (which are shown in FIG. 3) is smaller than about 45 percent (0.45).

Figure 2:
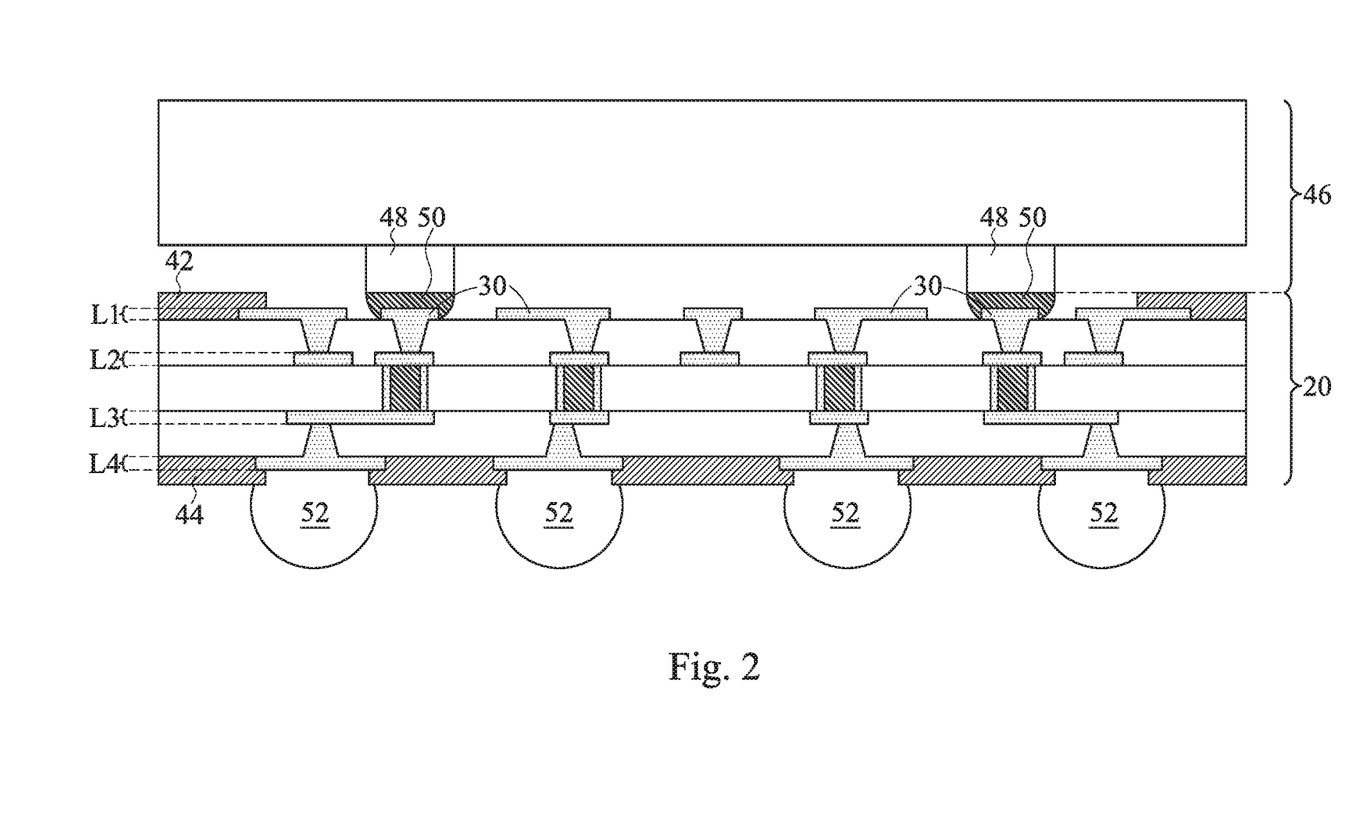
FIG. 2 illustrates the bonding of a package component to the package substrate through Bump-On-Trace (BOT) bonding in accordance with some alternative exemplary embodiments.

FIG. 2 illustrates a cross-sectional view of the bonding of device die 46 onto package substrate 20. In accordance with some embodiments, device die 46 includes active devices (not shown) such as transistors, passive devices (not shown) such as capacitors, resistors, inductors, or the like. Non-solder metal bumps 48 are formed at the surface of device die 46, wherein metal bumps 48 may include copper pillars, and may include one or more layers comprising nickel, gold, palladium, and/or the like. Solder regions 50 bond metal bumps 48 to metal traces 30. The bonding is through a Bump-On-Trace (BOT) method, wherein solder regions 50 are in contact with the top surface and the opposite sidewalls of metal traces 30. Different from the bonding schemes in which large metal pads are formed for bonding, metal traces 30 may have a substantially uniform width, with the unbonded portions that are not in contact with solder and the bonded portions that are in contact with solder having a uniform width (or a substantially uniform width).

FIG. 2 also illustrate solder balls 52 on metal pads 32. Hence, solder balls 52 are attached to metal layer L4 in accordance with the illustrated embodiments. Solder balls 52 are thus electrically coupled to metal bumps 48 through metal layers L1 through L4.

In FIGS. 1 and 2, package substrates 20 have cores 24. FIG. 3 illustrates a coreless package substrate 20, which does not include a core. Instead, a middle metal layer L5 is formed between layers L1/L2 and layers L3/L4. In these embodiments, the metal layer density of the middle metal layer L5 is not counted, and hence metal density difference ΔDL remains to be |(DL1+DL2) (DL3+DL4)|, wherein metal layer densities $DL_1$, $DL_2$, $DL_3$, and $DL_4$ are calculated essentially the same as in the embodiments shown in FIGS. 1 and 2. For these embodiments, metal density difference ΔDL is also selected to be smaller than about 10 percent (0.1), which means that the total metal area in L1 and L2 and the total area of L3 and L4 have a difference smaller than about 10 percent of the top view area of package substrate 20, as schematically shown in FIGS. 4, 5, 6, and 7. Furthermore, solder resist density difference ΔDSR is also |DSR1−DSR2|, and is selected to be smaller than about 50 percent (0.5), wherein densities DSR1 and DSR2 are the densities of solder resists 42 and 44, respectively. Solder resist density difference ΔDSR may also be smaller than about 45 percent (0.45).

The BOT bond structures, due to the thin metal traces 30 and small amount of solder in solder regions 50, are more prone to the bond failure due to the warpage of package substrate 20. For example, package substrates with the warpage equal to 12 μm, 17 μm, 21 μm-30 μm, and 27 μm-40 μm may have the joint yield of 98.5%, 96.5%, 90.0, and 61.0%, respectively. This indicates that the assembly yield has a direct relationship with the warpage of the package substrates. Accordingly, to improve the assembly yield, the warpage of the package substrate needs to be reduced, and hence the solder resist density difference ΔDSR and metal density difference ΔDL are controlled in the embodiments of the present disclosure.

The embodiments of the present disclosure have some advantageous features. In the embodiments of the present disclosure, by reducing the difference in the densities of the metal layers that are on opposite sides of the middle line of the package substrates, the warpage of the package substrates are reduced, and the assembly yield is increased significantly. Experiments are performed to form sample package substrates and to perform BOT bonding on the sample package substrates. In a first group of sample package substrates, metal layer density difference ΔDL is 10.40%, and solder resist density difference ΔDSR is 53.3%. In the second group of sample package substrates, metal layer density difference ΔDL is 6.42%, and solder resist density difference ΔDSR is 40.46%. In the third group of sample package substrates, metal layer density difference ΔDL is 8.25%, and solder resist density difference ΔDSR is 39.39%. The assembly yield values of the first, the second, and the third groups of package substrates in the BOT bonding are smaller than 90 percent (the industry accepted specification), higher than 96 percent, and higher than 98 percent, respectively. Accordingly, the first group of sample package substrates has an assembly yield lower than the generally acceptable assembly yield of the packaging industry, while the second and the third groups of sample package substrate have assembly yields higher than the generally acceptable assembly yield.

In accordance with some embodiments, a package includes a package substrate, which includes a middle layer selected from the group consisting of a core and a middle metal layer, a top metal layer overlying the middle layer, and a bottom metal layer underlying the middle layer. All metal layers overlying the middle layer have a first total metal density that is equal to a sum of all densities of all metal layers over the middle layer. All metal layers underlying the middle layer have a second total metal density that is equal to a sum of all densities of all metal layers under the middle layer. An absolute value of a difference between the first total metal density and the second total metal density is lower than about 0.1.

In accordance with other embodiments, a package includes a package substrate, which includes a core, a top metal layer overlying the core, and a bottom metal layer underlying the core. A first solder resist includes a portion level with the top metal layer, wherein the first solder resist has a first solder resist density. A second solder resist includes a portion level with the bottom metal layer. The second solder resist has a second solder resist density. An absolute value of a difference between the first solder resist density and the second solder resist density is lower than about 0.5.

In accordance with yet other embodiments, a package includes a package substrate, which includes a core. The core includes a dielectric layer, and conductive pipes penetrating through the dielectric layer. The package substrate further includes a first metal layer over the core, wherein the first metal layer has a first metal density, a top metal layer overlying the first metal layer, wherein the top metal layer has a second metal density, a second metal layer under the core, wherein the second metal layer has a third metal density, and a bottom metal layer underlying the second metal layer. The bottom metal layer has a fourth metal density. A first sum of the first metal density and the second metal density minus a second sum of the third metal density and the fourth metal density have an absolute value smaller than about 0.1. The package further includes a first solder resist comprising a portion level with the top metal layer, wherein the first solder resist has a first solder resist density, and a second solder resist comprising a portion level with the top metal layer. The second solder resist has a second solder resist density. An absolute value of a difference between the first solder resist and the second solder resist is lower than about 0.5.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
  a package substrate comprising:
    a first plurality of vias in a first via layer, wherein each of the first plurality of vias has a first top width and a first bottom width smaller than the first top width;
    at least one first metal layer over the first via layer, wherein all metal layers over the first via layer in combination have a first total metal area, wherein the at least one first metal layer comprises a topmost metal layer, and the topmost metal layer comprises a first plurality of metal traces and a second plurality of metal traces;
    a first solder resist covering and contacting the first plurality of metal traces, and the second plurality of metal traces are not covered by the first solder resist;
    a second plurality of vias in a second via layer, wherein each of the second plurality of vias has a second top width and a second bottom width greater than the second top width;
    at least one second metal layer underlying the second via layer, wherein all metal layers under the second via layer have a second total metal area, and wherein an absolute value of a ratio of a difference between the first total metal area and the second total metal area to a total top-view area of the package substrate is lower than about 0.1, and wherein the at least one second metal layer comprises a bottommost metal layer; and
    a second solder resist having portions underlying the bottommost metal layer, wherein each of metal traces in the bottommost metal layer has a bottom surface at least partially in contact with the second solder resist.

2. The package of claim 1, wherein the at least one second metal layer and the second via layer are underlying the first metal layer and the first via layer.

3. The package of claim 1, wherein in a cross-sectional view of the package, the first plurality of vias tapers toward the second via layer, and the second plurality of vias tapers toward the first via layer.

4. The package of claim 1 further comprising:
  a core dielectric layer; and
  a plurality of conductive pipes in the core dielectric layer, wherein each of the plurality of conductive pipes electrically couples one of the first plurality of vias to one of the second plurality of vias.

5. The package of claim 4 further comprising:
  a first plurality of metal features physically contacting top ends of the plurality of conductive pipes, wherein the first plurality of vias is in physical contact with top surfaces of the first plurality of metal features; and
  a second plurality of metal features physically contacting bottom ends of the plurality of conductive pipes, wherein the second plurality of vias is in physical contact with bottom surfaces of the second plurality of metal features.

6. The package of claim 1
  wherein the first solder resist has a first total area; and
  wherein the second solder resist has a second total area, and a ratio of a difference between the first total area and the second total area to the total top-view area of the package substrate is smaller than about 0.45.

7. The package of claim 1, wherein the all metal layers over the first via layer in combination have first patterns different from second patterns of the all metal layers under the second via layer in combination.

8. The package of claim 1 further comprising a solder region contacting a top surface and sidewalls of a first trace in the second plurality of metal traces, wherein a second trace in the second plurality of metal traces is spaced apart from all solder regions in the package.

9. The package of claim 8, wherein one of the first plurality of metal traces has a top surface, with a part of the top surface uncovered by the solder region and not in contact with any solder region.

10. The package of claim 8, wherein each of metal traces in the bottommost metal layer has a bottom surface in contact with an additional solder region.

11. A package comprising:
  a package substrate comprising:
    a first plurality of vias in a first via layer, wherein each of the first plurality of vias has a first top width and a first bottom width smaller than the first top width;
    at least one first metal layer over the first via layer, wherein all metal layers over the first via layer in combination have a first total metal area, wherein the at least one first metal layer comprises a topmost metal layer, and the topmost metal layer comprises a first plurality of metal traces and a second plurality of metal traces;

a first solder resist covering and contacting the first plurality of metal traces, and the second plurality of metal traces are not covered by the first solder resist;

a second plurality of vias in a second via layer, wherein each of the second plurality of vias has a second top width and a second bottom width greater than the second top width; and a middle metal layer between the first via layer and the second via layer, and the first plurality of vias have bottom surfaces in physical contact with metal lines in the middle metal layer, and the second plurality of vias have top surfaces in physical contact with the metal lines in the middle metal layer;

at least one second metal layer, wherein all metal layers under the second via layer have a second total metal area, and wherein an absolute value of a ratio of a difference between the first total metal area and the second total metal area to a total top-view area of the package substrate is lower than about 0.1, wherein a first total count of the all metal layers over the first via layer is equal to a second total count of the all metal layers under the second via layer, and wherein the at least one second metal layer comprises a bottommost metal layer;

a second solder resist having portions underlying the bottommost metal layer, wherein each of metal traces in the bottommost metal layer has a bottom surface at least partially in contact with the second solder resist; and a device die bonded to the package substrate through bump-on-trace bonding.

12. The package of claim 11, wherein the all metal layers over the first via layer in combination have first patterns different from second patterns of the all metal layers under the second via layer in combination.

13. The package of claim 11 further comprising a solder region contacting a top surface and sidewalls of a first trace in the second plurality of metal traces, wherein a second trace in the second plurality of metal traces is spaced apart from all solder regions in the package.

14. The package of claim 13, wherein one of the first plurality of metal traces has a top surface, with a part of the top surface uncovered by the solder region and not in contact with any solder region.

15. The package of claim 13, wherein each of metal traces in the bottommost metal layer has a bottom surface in contact with an additional solder region.

16. A package comprising:
a package substrate comprising:
a first plurality of vias in a first via layer, wherein each of the first plurality of vias has a first top width and a first bottom width smaller than the first top width;
at least one first metal layer over the first via layer, wherein all metal layers over the first via layer in combination have a first total metal area, wherein the at least one first metal layer comprises a topmost metal layer, and the topmost metal layer comprises a first plurality of metal traces and a second plurality of metal traces;

a first solder resist covering and contacting the first plurality of metal traces, and the second plurality of metal traces are not covered by the first solder resist;

a second plurality of vias in a second via layer, wherein each of the second plurality of vias has a second top width and a second bottom width greater than the second top width;

at least one second metal layer, wherein all metal layers under the second via layer have a second total metal area, and wherein an absolute value of a ratio of a difference between the first total metal area and the second total metal area to a total top-view area of the package substrate is lower than about 0.1;

a topmost dielectric layer over the all metal layers over the first via layer, wherein the topmost dielectric layer has a first total area; and a bottommost dielectric layer under the all metal layers under the second via layer, wherein the bottommost dielectric layer has a second total area, and a ratio of a difference between the first total area and the second total area to the total top-view area of the package substrate is smaller than about 0.45, and wherein the at least one second metal layer comprises a bottommost metal layer;

a second solder resist having portions underlying the bottommost metal layer, wherein each of metal traces in the bottommost metal layer has a bottom surface at least partially in contact with the second solder resist; and a device die bonded to the package substrate through bump-on-trace bonding.

17. The package of claim 16, wherein the all metal layers over the first via layer in combination have first patterns different from second patterns of the all metal layers under the second via layer in combination.

18. The package of claim 16 further comprising a solder region contacting a top surface and sidewalls of a first trace in the second plurality of metal traces, wherein a second trace in the second plurality of metal traces is spaced apart from all solder regions in the package.

19. The package of claim 18, wherein one of the first plurality of metal traces has a top surface, with a part of the top surface uncovered by the solder region and not in contact with any solder region.

20. The package of claim 18, wherein each of metal traces in the bottommost metal layer has a bottom surface in contact with an additional solder region.

* * * * *